(12) United States Patent
Hsu

(10) Patent No.: US 7,651,349 B2
(45) Date of Patent: Jan. 26, 2010

(54) ELECTRICAL CONNECTOR HAVING A SLIDING PLATE CAPABLE OF VERTICAL AND HORIZONTAL MOVEMENT

(75) Inventor: Hsiu-Yuan Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/291,140

(22) Filed: Nov. 5, 2008

(65) Prior Publication Data
US 2009/0117771 A1 May 7, 2009

(30) Foreign Application Priority Data
Nov. 5, 2007 (TW) .............................. 96218580 U

(51) Int. Cl.
*H01R 13/62* (2006.01)

(52) U.S. Cl. ..................................................... 439/152

(58) Field of Classification Search ................. 439/347, 439/157, 152, 160, 310, 595, 594
See application file for complete search history.

(56) References Cited

U.S. PATENT DOCUMENTS
7,011,536 B2 *  3/2006  Okamoto et al. ............ 439/157

\* cited by examiner

*Primary Examiner*—Chandrika Prasad
(74) *Attorney, Agent, or Firm*—Andrew C. Cheng; Wei Te Chung; Ming Chieh Chang

(57) ABSTRACT

An electrical connector (1) comprises an insulative housing (2), an sliding plate (3) positioned on the insulative housing (2), a plurality of contacts (9) positioned in the insulative housing (2) and each having a portion interconnected to the sliding plate (3), a slant guiding portion (313) and a shaft (25) positioned on the slant guiding portion (313) to make the sliding plate (3) to move in the vertical direction when the sliding plate (3) is urged to move in the horizontal direction.

20 Claims, 8 Drawing Sheets

ELECTRICAL CONNECTOR HAVING A SLIDING PLATE CAPABLE OF VERTICAL AND HORIZONTAL MOVEMENT

BACKGROUND OF THE INVENTION

1. Field of the Invention

The present invention relates to an electrical connector, and more particularly, to a so-called burn-in socket connector having a sliding plate moves along a vertical direction for easily separating the balls of the electronic package with contact tips of the electrical connector.

2. Description of the Prior Art

Electronic packages mounted on an electronic equipment or others are subjected to various tests at a stage prior to being actually mounted so that latent defects therein are removed. The test is performed nondestructively through application of voltage stress, high-temperature operation, and high-temperature storage corresponding to thermal and mechanical environment tests or the like. Among these tests, there is a burn-in test effective for removing initial inoperable integrated circuits, in which an operation test is performed under a high temperature condition for a predetermined time.

FIG. 1 disclosed such a test socket 1', comprises a base member 2', a sliding plate 3' assembled to the base member 2', a top plate 4' positioned on the sliding plate 3', a plurality of contacts 9' received in the base member 2' and the sliding plate 3', a pair of pressing members 6' assembled to the base member 2' and moving up to down along the base member 2', a pair of locking members 5' assembled to the two sides of the base member 2' and a fastened member 7' positioned under the base member 2'. The fastened member 7' comprises a fasten plate 72' and a bottom plate 71' positioned on the fasten plate 72'. The base member 2' comprises a receiving space 21' for receiving the sliding plate 3', the sliding plate 3' can move in the horizontal direction in the receiving plate 3'.

Referring to FIG. 2, showing the contacts 9' connecting with the test electronic package 10'. The contacts 9' comprises a first arm 91' and a second arm 92' relative to the first arm 91'. The first arm 91' and the second arm 92' go through the sliding plate 3'. The electronic package 10' positioned on the sliding plate 3' and comprises a plurality of solder balls 101' on the lower surface of the electronic package 10'. When the sliding plate 3' moved in the receiving space 21' along the horizontal direction, the first arm 91' and the second arm 92' move close to or far away from each other. When the first arm 91' and the second arm 92' move far away from each other, the solder balls 101' will separate with the contacts 9', and then can take the electronic package 10' out from the test socket 1'.

However, the test is performed under high-temperature operation, so the solder balls 101' melt and paste on the first arm 91' and the second arm 92' of the contacts during the test processing, which make it difficult to take the electronic package 10' out from the test socket 1', then will reduce the test efficiency. On the other hand, if exert a strong force to take the electronic package 10', it will damage the electronic package 10' and the contacts 9'.

In view of the above, a new electrical connector assembly that overcomes the above-mentioned disadvantages is desired.

SUMMARY OF THE INVENTION

Accordingly, an object of the present invention is to provide an electrical connector having a sliding plate moves in the vertical direction for easily separating the solder ball of the electronic package with the contacts of the electrical connector.

To fulfill the above-mentioned object, An electrical connector comprises an insulative housing, an sliding plate positioned on the insulative housing, and a plurality of contacts positioned in the insulative housing and each having a portion interconnected to the sliding plate, a slant guiding portion and a shaft positioned on the slant guiding portion to make the sliding plate to move in the vertical direction when the sliding plate is urged to move in the horizontal direction.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
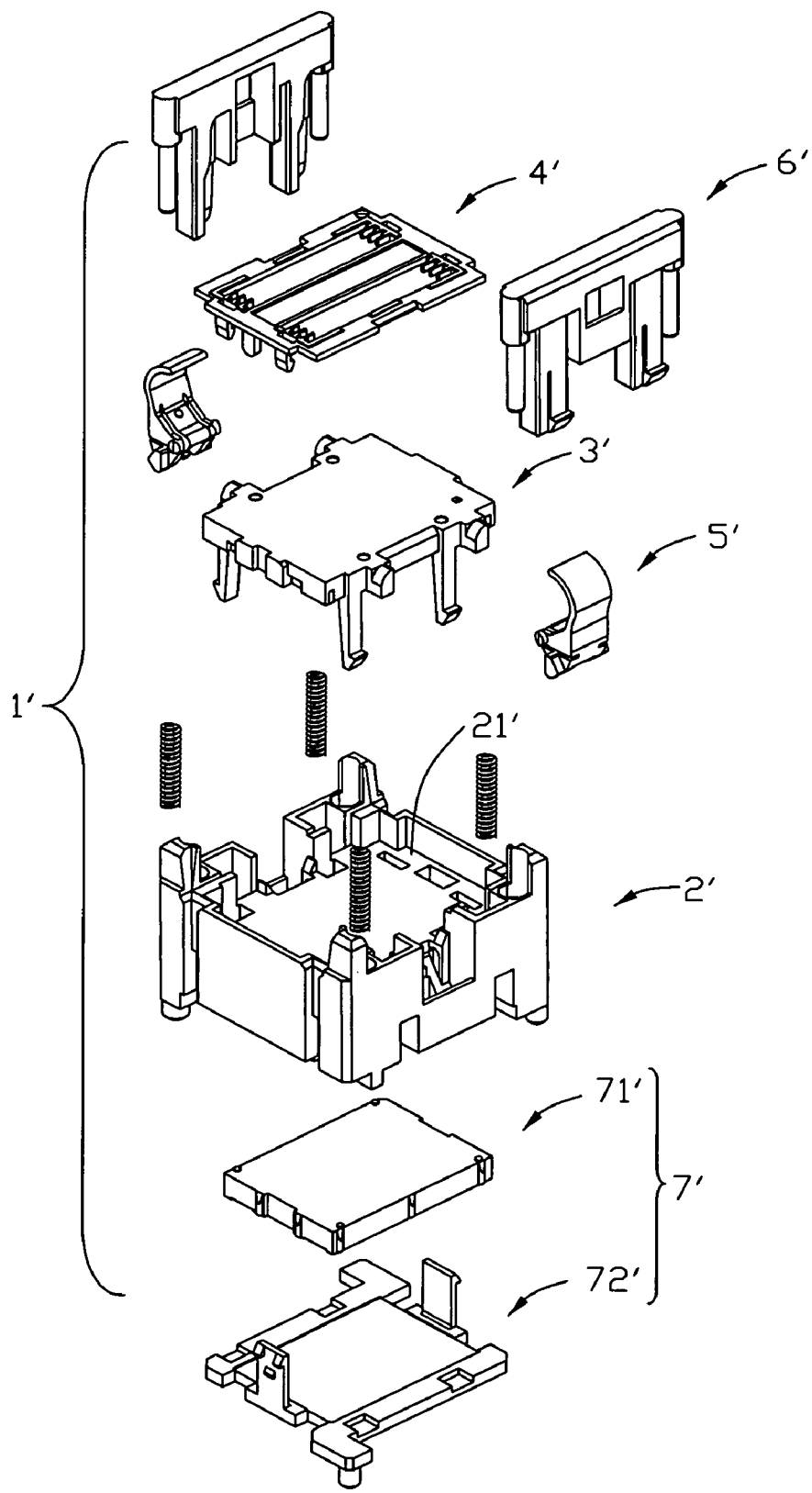
FIG. 1 is an exploded view of a conventional electrical connector.
Figure 2:
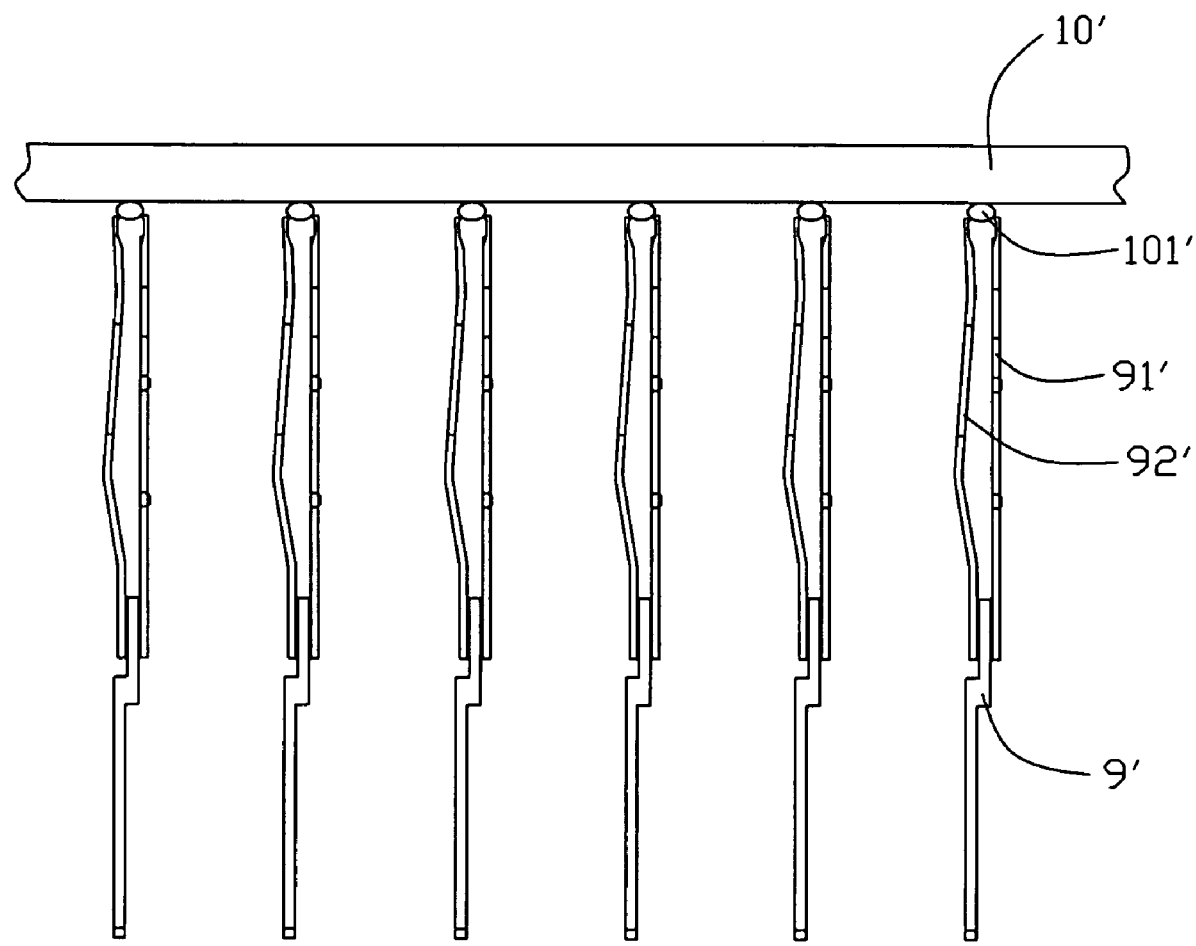
FIG. 2 is isometric view showing the contacts in FIG. 1 connecting with an electrical package.
Figure 3:
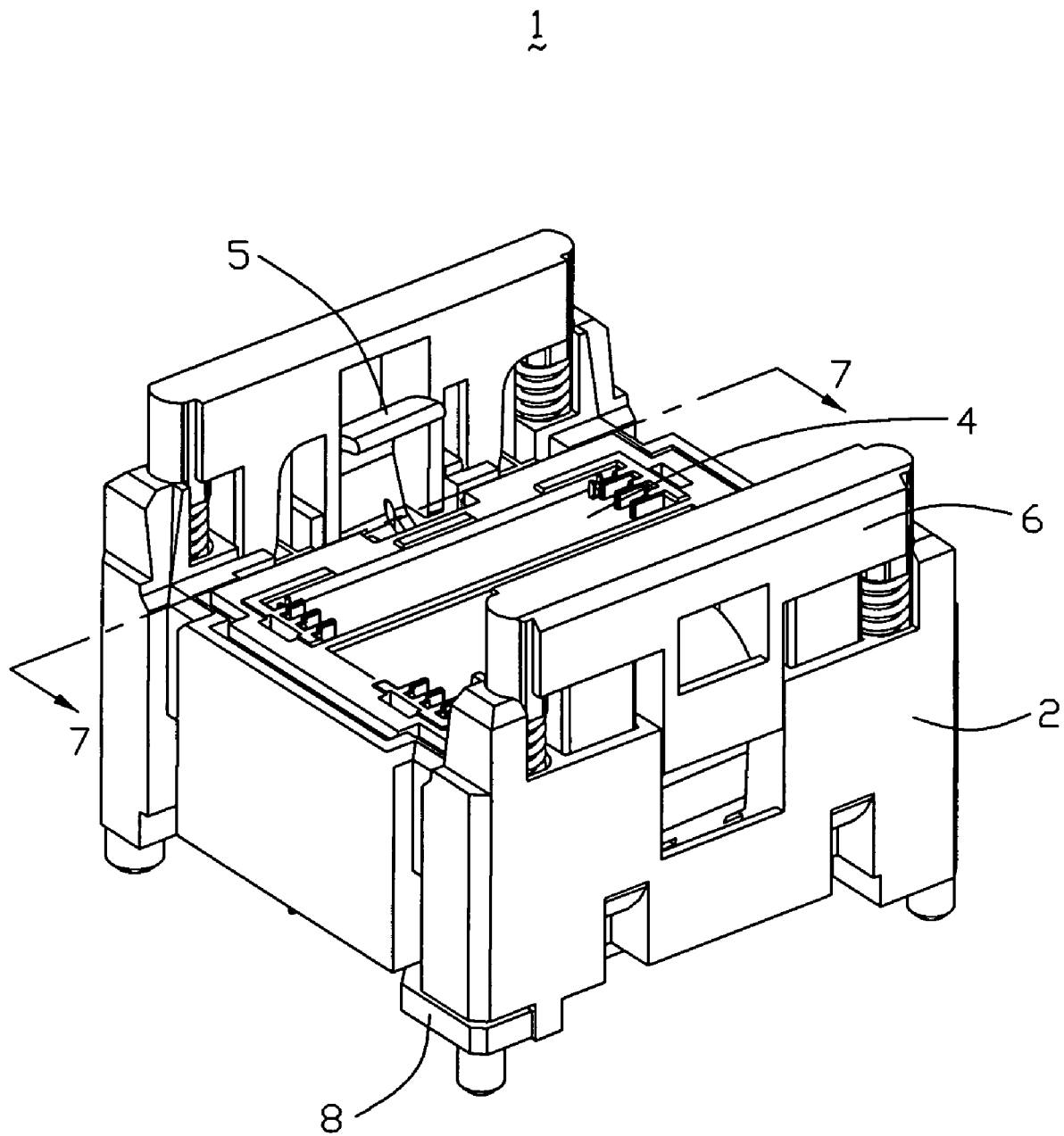
FIG. 3 is an assembled view of an electrical connector in accordance with the preferred embodiment of the present invention.
Figure 4:
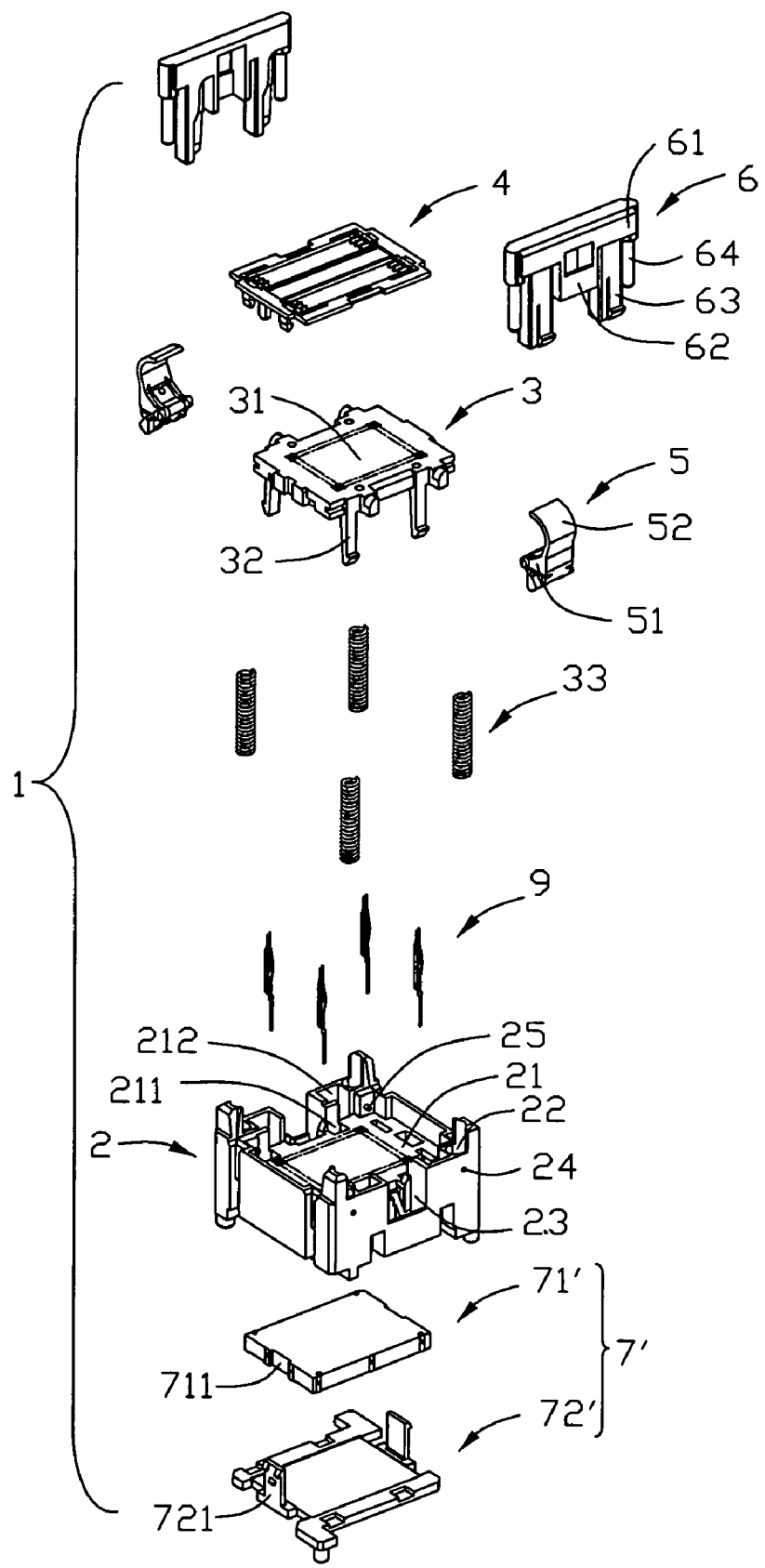
FIG. 4 is an exploded view of the electrical connector in FIG. 3.
Figure 5:
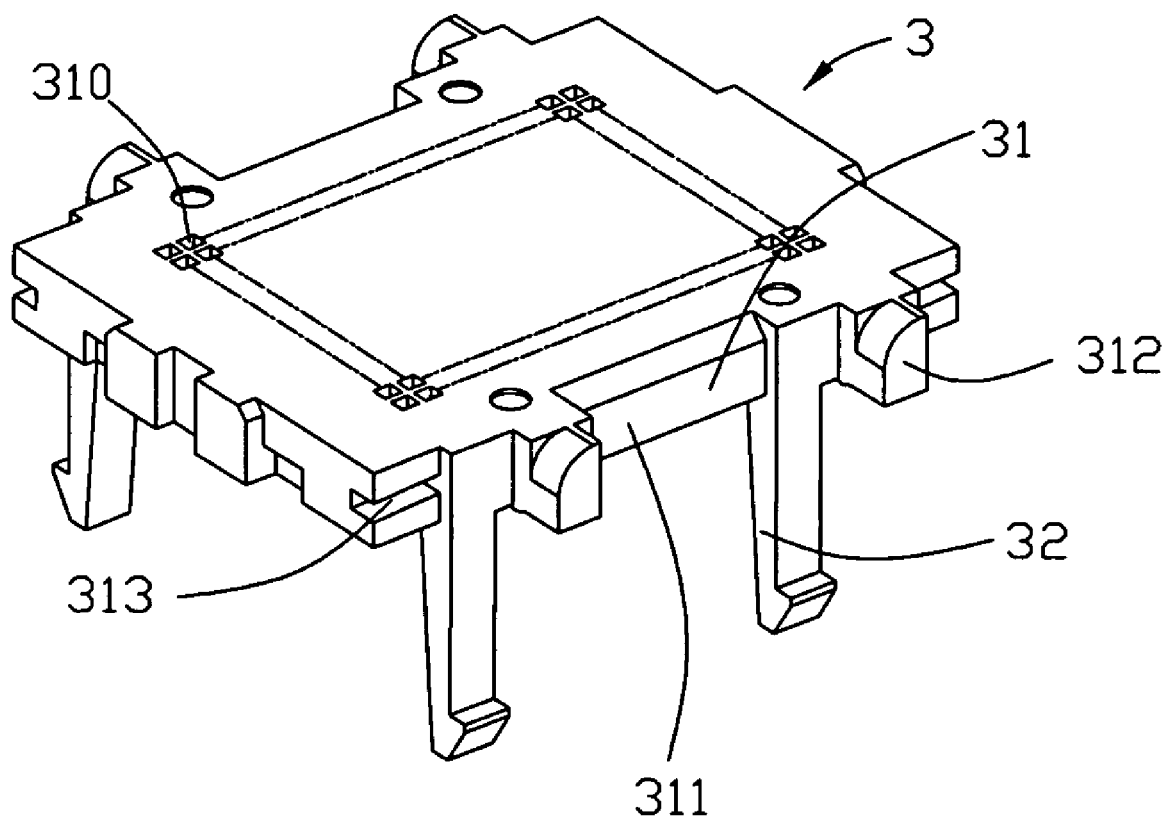
FIG. 5 is an isometric view of the sliding plate of FIG. 1.
Figure 6:
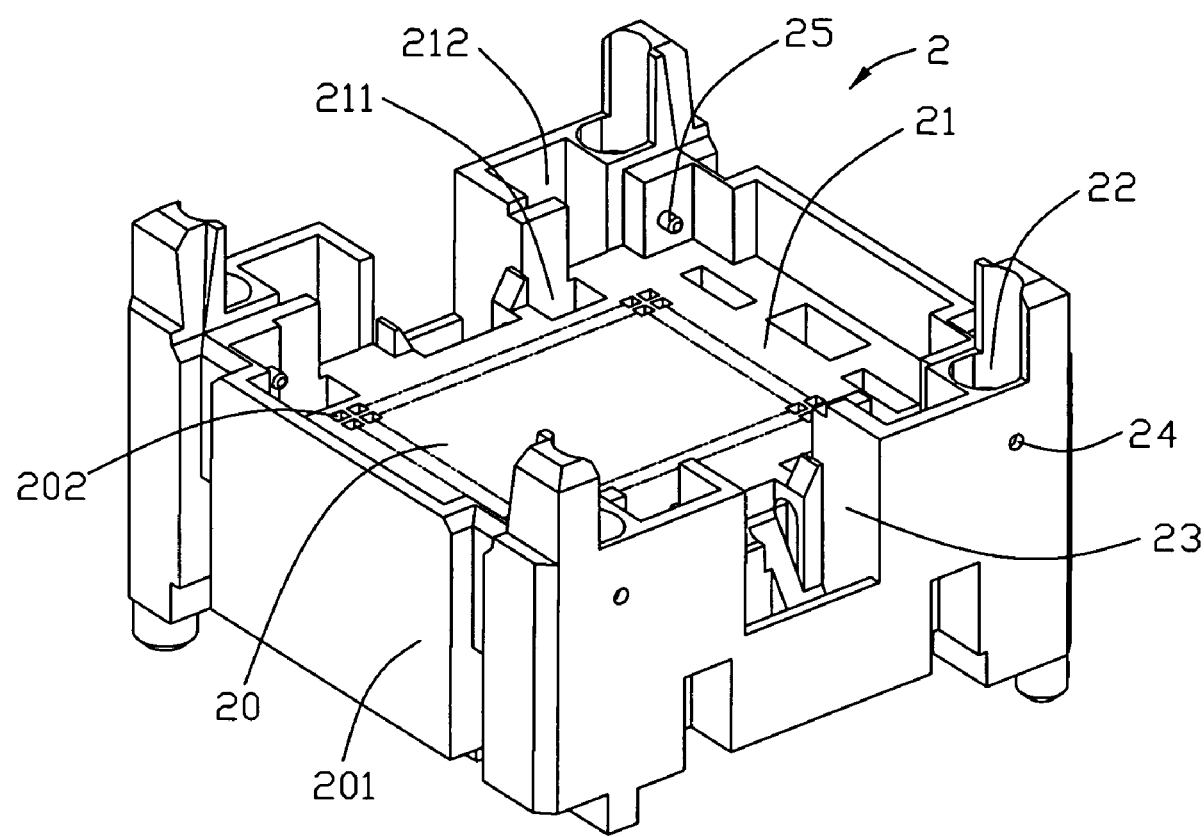
FIG. 6 is an isometric view of the base member of FIG. 1.

Referring to FIGS. 3-4, showing an electrical connector 1 in accordance with the preferred embodiment of the present invention, and comprises a base member 2, a sliding plate 3 assembled to the base member 2, a top plate 4 positioned on the sliding plate 3, a plurality of contacts 9 received in the base member 2 and the sliding plate 3, a pair of locking members 5 assembled to the two sides of the base member 2, a pressing member 6 pivotally connected with the base member 2 and can exert a force on the locking member 5, and a fastened member 7 positioned under the base member 2.

Referring to FIGS. 3-7, the base member 2 is configured to a rectangular shape and comprises a bottom wall 20, sidewalls 201 extending upwardly from the bottom wall 20 and a receiving space 21 formed by the bottom wall 20 and the sidewalls 201. The bottom wall 20 defines a plurality of first passageways 202 for receiving the contacts 9, the bottom wall 20 also defines a pair of first fixing holes 211 in the periphery thereof for fixing the sliding plate 3. The sidewall 201 defines a second fixing holes 212 near the first fixing holes 211 for fixing the pressing members 6 and a recess 23 in the middle of the two second fixing holes 212 for fixing the locking member 5. The sidewall 201 also defines a pair of receiving holes 24 on the two sides of the recess 23 and the receiving hole 24 is above the bottom wall 20. The base member 2 also comprises a shaft 25 received in the receiving hole 24 and the shaft 25 extending to the receiving space 21 of the base member 2. In this embodiment, the base member 2 comprises four shafts, although the quantity of the shaft 25 is not limited, it can also be two or more and the shaft 25 can also be one part of the base member 2 with a insert-mode method. The connecting portion of the two sidewalls 201 defines a receiving recess 22 for receiving a spring 33.

The sliding plate 3 is configured to a rectangular shape and comprises a support portion 31 and a plurality of hooks 32 extending downwardly from the support portion 31. The support portion 31 defines a plurality of passageways 310 for receiving the contacts 9 and four side surfaces 311. The two opposite side surfaces 311 each defines a pair of protruding portions 312 and the top surface of the protruding portions 312 is configured to a arc shape. The two end of the side surfaces 311 each defines a slot 313 configured to a slant shape for receiving the shaft 25 and the shaft 25 engages with the slot 313 and drive the sliding plate 3 move. The hooks 32 are positioned in the first fixing holes 211. The shaft 25 can also be set on the sliding plate 3 and the slot 313 can also be set on the base member 2, which can also work. The top plate 4 is positioned on the sliding plate 3 for supporting the electronic package (not showing), and the top plate 4 and the sliding plate 3 together move in the receiving space 21 of the base member 2.

The locking member 5 is positioned in the recess 23 of the base member 2 and comprises a fixing portion 51 and a locking portion 52 extending curvedly and upwardly from the fixing portion 51. The fixing portion 51 fixed in the recess 23 of the base member 2 and the top of the locking portion 52 extending curvedly facing the receiving space 21.

The pressing member 6 has a plate shape and comprises a base portion 61, a pressing portion 62 extending downwardly from the middle of the base portion 61 for pressing the locking members 5 and a pair of guiding post 64, fixing hooks 63 positioned on the two sides of the pressing portion 62. The guiding post 64 is assembled into the spring 33 in the receiving recess 22 and the spring 33 can make the pressing member 6 move to the initial state.

The fastened member 7 comprises a fasten plate 72 and a bottom plate 71 positioned on the fasten plate 72. The bottom plate 71 with a plate shape and comprises a second recess 711. The fasten plate 72 has a plate shape and comprises a second hooks 721 extending upwardly. The second hook 721 goes through the second recess 711 of the bottom plate 7 and interlocked with the base member 2.

Figure 7:
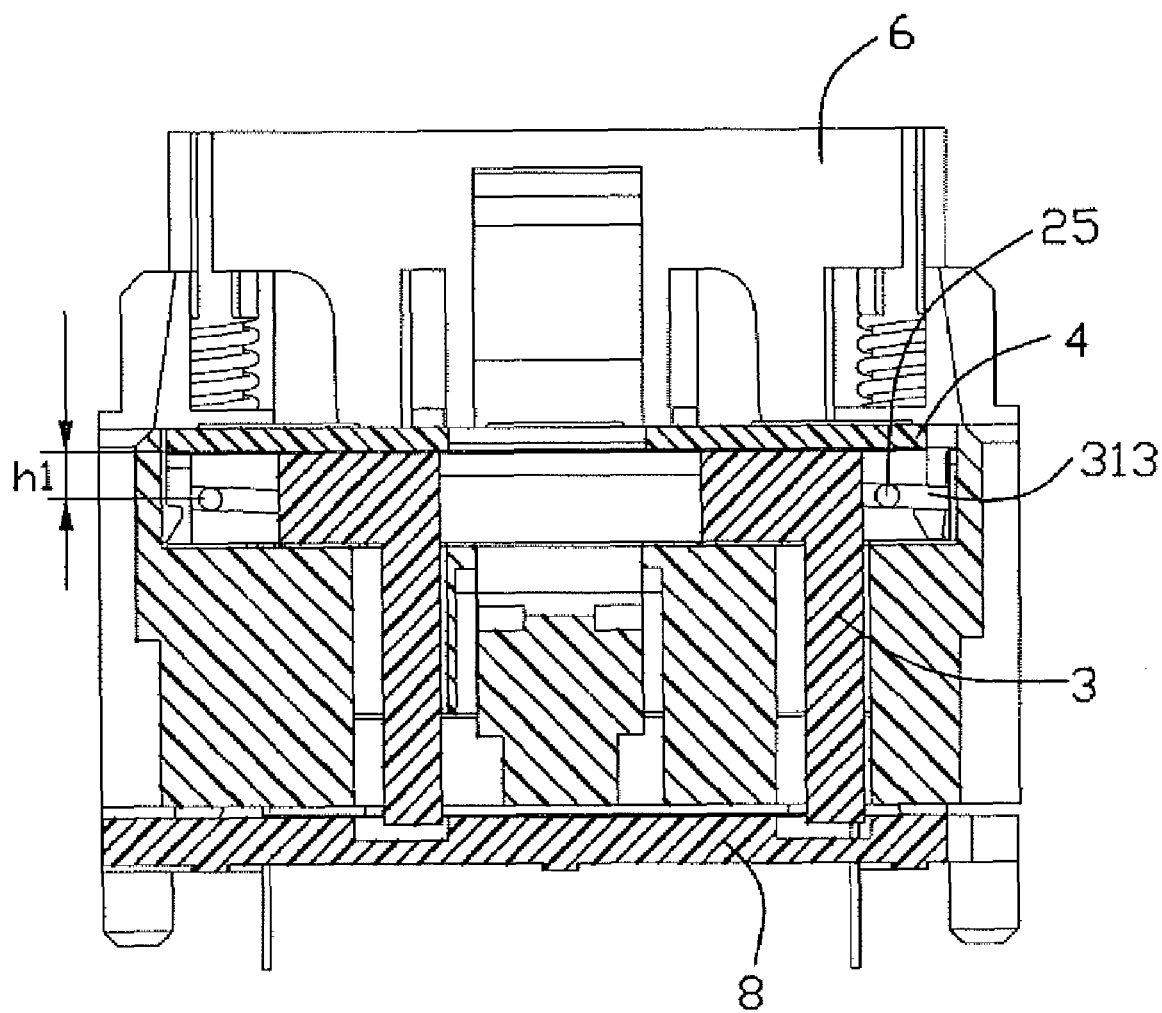
FIG. 7 is a cross-sectional view of the electrical connector in FIG. 3 along the line 7-7, shown the sliding plate is in a lowest point.
Figure 8:
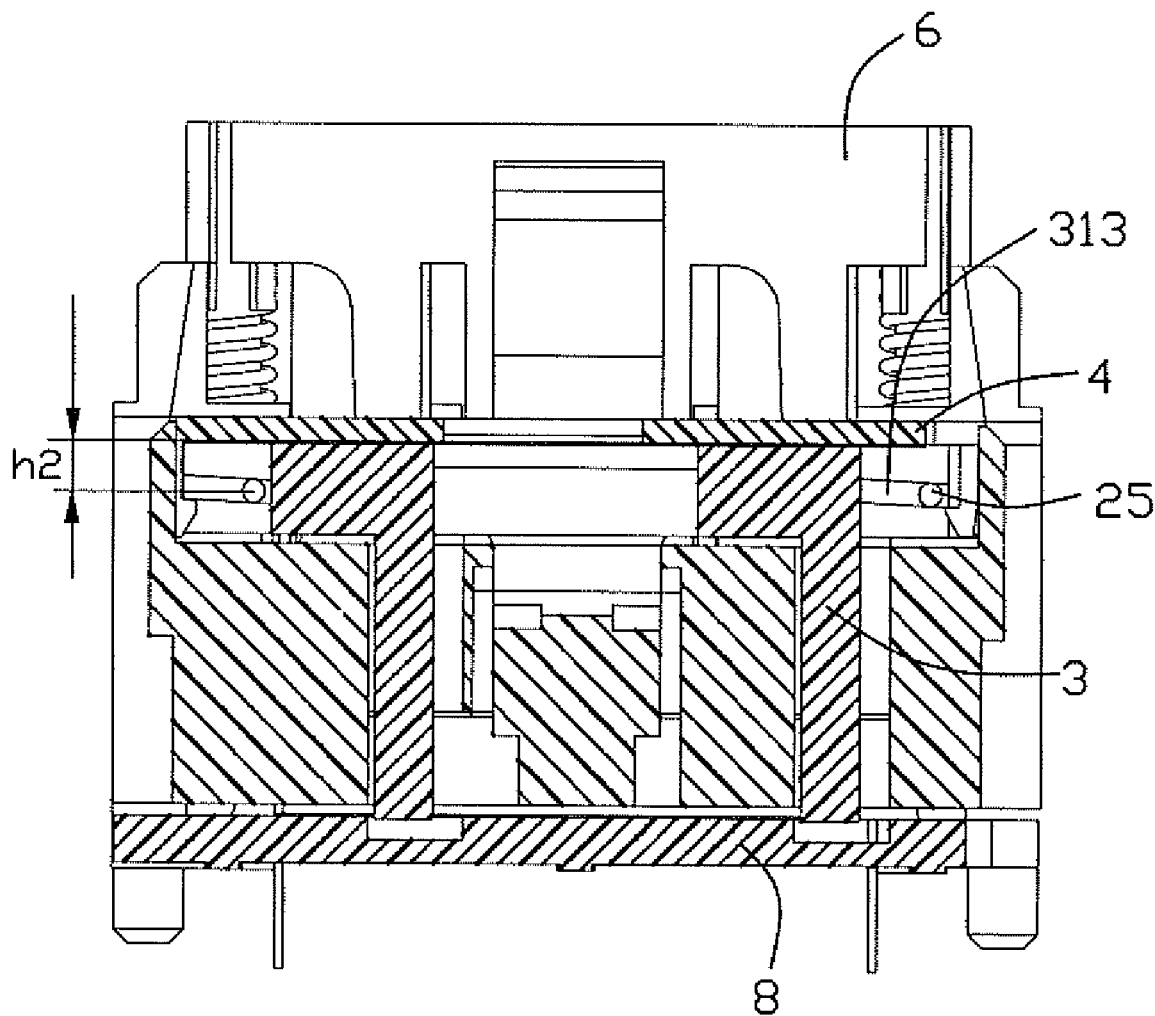
FIG. 8 is similar to FIG. 7, shown the sliding plate is in a highest point.

Referring to FIGS. 7-8, when the electrical connector 1 is assembled, the top plate 4 is positioned on the sliding plate 3 and located in the receiving space 21 of the base member 2, the shaft 25 is positioned in the slot 313 to restrict the movement of the sliding plate 3. At this time, the sliding plate 3 is at the lowest position, the distance between the upper surface of the sliding plate 3 and the shaft 25 is h1. The contacts 9 are received in the base member 2 and the sliding plate 3 to contact with the solder balls of the electronic package. After tested, when exert a downward force on the base portion 61 of the pressing member 6, the locking member 5 opened and the sliding plate 3 moved in the horizontal direction, the shaft 25 is received in the slot 313, due to the slot 313 is configured to a slant shape, the sliding plate 3 are drived to move upwardly to the highest position, the distance between the upper surface of the sliding plate 3 and the shaft 25 is h2, and h2 is larger than h1, then can make the top plate 4 move upwardly in the vertical direction and the electronic package is urged by the top plate 4 to separated with the contacts 9.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulative housing;
   a sliding plate assembled on the insulative housing and moveably along a horizontal direction;
   a top plate positioned on the sliding plate; and
   a plurality of contacts received in the insulative housing and extending beyond the upper surface of the top plate; wherein
   a slant slot is formed in one of the housing and the sliding plate, and a shaft is formed on the other to be positioned in the slot to make the sliding plate to move in a vertical direction to drive the top plate to move in the vertical direction.

2. The electrical connector as claimed in claim 1, wherein an electrical package is positioned on the top plate to connect with the contact and the electrical package is urged to move upwardly to disconnect with the contact.

3. The electrical connector as claimed in claim 1, wherein the slot is set on the insulative housing and the shaft is set on the sliding plate.

4. The electrical connector as claimed in claim 2, wherein the slot is set on the sliding plate and the shaft is set on the insulative housing.

5. The electrical connector as claimed in claim 3, wherein the insulative housing comprises a bottom wall, sidewalls extending upwardly from the bottom wall and a receiving space formed by the bottom wall and the sidewalls.

6. The electrical connector as claimed in claim 5, wherein the sliding plate positioned in the receiving space.

7. The electrical connector as claimed in claim 5, wherein the shaft extends from the sidewall into the receiving space perpendicularly to match with the slot to support the sliding plate.

8. The electrical connector as claimed in claim 1, wherein the electrical connector comprises a pressing member positioned in the insulative housing and moving up to down along the insulative housing to urge the sliding plate to move.

9. The electrical connector as claimed in claim 1, wherein the sliding plate includes a fixing portion extending downwardly, and the fixing portion includes a hook portion at the end thereof interlocked with the insulative housing.

10. The electrical connector assembly as claimed in claim 8, wherein sliding plate is urged by said pressing member to move in the horizontal direction so as to result in movement thereof in said vertical direction due to cooperation of said shaft and said slanted slot.

11. The electrical connector assembly as claimed in claim 10, wherein during normal use, said shaft is constantly back and forth movable along said slanted slot without withdrawal therefrom.

12. An electrical connector comprising:
   an insulative housing comprising a bottom wall, sidewalls extending upwardly from the bottom wall and a receiving space formed by the bottom wall and the sidewalls;
   a sliding plate positioned in the receiving space of the insulative housing and moving in a horizontal direction;
   a plurality of contacts received in the bottom wall of the insulative housing and extending into the receiving space, each contact having a portion interconnected to the sliding plate; and an electronic package positioned above the sliding plate to connect with the contacts; wherein the sliding plate comprises a slot in a slant shape and the insulative housing comprises a shaft positioned in the slot to make the sliding plate to move in a vertical direction and urge the electronic package to disconnect with the contact.

13. The electrical connector as claimed in claim 12, wherein the electrical connector comprises a pressing member positioned in the insulative housing and moving up to down along the insulative housing to urge the sliding plate to move in the horizontal direction.

14. The electrical connector as claimed in claim 12, wherein movement of the sliding plate in said horizontal direction results in movement thereof in said vertical direction due to cooperation of said shaft and said slot.

15. The electrical connector assembly as claimed in claim 14, wherein during normal use, said shaft is constantly back and forth movable along said slanted slot without withdrawal therefrom.

16. An electrical connector assembly comprising:

an insulative base member having a plurality passageways to receive a plurality of contacts therein;

a sliding plate receiving upper ends of the contacts and guidably moveable within the base at least in a vertical direction;

a pressing member actuating said sliding plate when said pressing member is downwardly pressed; and an electronic package positioned above the sliding plate so that the electronic package is forced to move upward by upward movement of the sliding plate to a limited height when said sliding plate is actuated by said pressing member to make horizontal movement of the sliding plate which results in said upward movement of the sliding plate simultaneously.

17. The electrical connector assembly as claimed in claim 16, wherein a slanted slot is formed in one of the housing and the sliding plate, and a protruding pin is formed on the other to be received in the slot so as to cause said upward movement of the sliding plate.

18. The electrical connector assembly as claimed in claim 17, wherein said slot is formed in the sliding plate and said protruding pin is formed on the housing.

19. The electrical connector assembly as claimed in claim 16, wherein during normal use, said sliding plate is restrained to be moved in a limited range in both said upward movement and said horizontal movement.

20. The electrical connector as claimed in claim 17, wherein during normal use, said protruding pin is constantly back and forth moved in said slot without withdrawal therefrom.

* * * * *